United States Patent
Mashino

(10) Patent No.: US 8,007,649 B2
(45) Date of Patent: Aug. 30, 2011

(54) HYDROPHILIC TREATMENT METHOD AND WIRING PATTERN FORMING METHOD

(75) Inventor: Naohiro Mashino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 1472 days.

(21) Appl. No.: 11/049,774

(22) Filed: Feb. 3, 2005

(65) Prior Publication Data

US 2005/0173251 A1 Aug. 11, 2005

(30) Foreign Application Priority Data

Feb. 6, 2004 (JP) .................................. 2004-030110

(51) Int. Cl.
*C25D 5/02* (2006.01)
*H05H 1/00* (2006.01)

(52) U.S. Cl. .................... 205/125; 205/205; 427/436

(58) Field of Classification Search .................. 205/125, 205/170, 205; 204/192.32, 165, 169; 427/535, 427/536
See application file for complete search history.

(56) References Cited

U.S. PATENT DOCUMENTS

| | | | |
|---|---|---|---|
| 4,364,970 A * | 12/1982 | Imada et al. .................. | 427/536 |
| 4,929,319 A * | 5/1990 | Dinter et al. .................. | 204/164 |
| 5,028,453 A | 7/1991 | Jeffrey et al. | |
| 5,124,173 A | 6/1992 | Uchiyama et al. | |
| 5,316,739 A * | 5/1994 | Yoshikawa et al. ....... | 422/186.05 |
| 5,344,462 A * | 9/1994 | Paskalov et al. .............. | 8/115.52 |
| 5,419,968 A * | 5/1995 | Okada et al. .................. | 428/421 |
| 5,543,017 A * | 8/1996 | Uchiyama et al. ............ | 204/169 |
| 5,858,472 A * | 1/1999 | Iwata et al. .................... | 427/536 |
| 5,895,558 A * | 4/1999 | Spence ........................... | 204/164 |
| 6,194,062 B1 * | 2/2001 | Hamilton et al. ............. | 428/343 |
| 6,342,275 B1 | 1/2002 | Miyakawa et al. | |
| 2001/0017221 A1* | 8/2001 | Horiuchi et al. .............. | 174/260 |
| 2003/0165633 A1* | 9/2003 | Ryu et al. ...................... | 427/535 |

FOREIGN PATENT DOCUMENTS

| | | | |
|---|---|---|---|
| JP | 02123140 A | * | 5/1990 |
| JP | 7-207449 | | 8/1995 |
| JP | 11-158671 | | 6/1999 |
| JP | 2000-127407 | | 5/2000 |
| JP | 2000-133933 | | 5/2000 |
| JP | 2001-281862 | | 10/2001 |

(Continued)

OTHER PUBLICATIONS

Database WPI Week 200025, Derwent Publications Ltd., London, GB; AN 2000-286784, XP002371140 & JP 2000 080184 A (Dainippon Printing Co Ltd) Mar. 21, 2000 abstract.

(Continued)

*Primary Examiner* — Luan V Van
(74) *Attorney, Agent, or Firm* — Rankin, Hill & Clark LLP

(57) ABSTRACT

A plasma treatment is performed on the surface of one side of a polyimide film made of a resin. When wettability is imparted to the surface of the one side of the polyimide film, the plasma treatment is performed on the surface of the one side of the polyimide film to which sprayed water adhere.

14 Claims, 2 Drawing Sheets

FOREIGN PATENT DOCUMENTS

| | | |
|---|---|---|
| JP | 2002-076573 | 3/2002 |
| JP | 2002-356794 | 12/2002 |
| JP | 2003-045871 | 2/2003 |
| JP | 2003045871 A * | 2/2003 |
| JP | 2003-089726 | 3/2003 |
| JP | 2003-115662 | 4/2003 |
| WO | 95/18249 | 7/1995 |

OTHER PUBLICATIONS

Database WPI Week 199445, Derwent Publications Ltd., London, GB; AN 1994-362747 XP002371141 & JP 06 285365 A (EC Kagaku KK) Oct. 11, 1994 abstract.

Database WPI Week 199225, Derwent Publications Ltd., London, GB; AN1992-205079 XP002371142 & JP 04 135638 A (EC Kagaku Kogyo KK) May 11, 1992 abstract.

* cited by examiner

HYDROPHILIC TREATMENT METHOD AND WIRING PATTERN FORMING METHOD

This application claims foreign priority based on Japanese patent application JP 2004-030110, filed on Feb. 6, 2004, the contents of which is incorporated herein by reference in its entirety.

BACKGROUND OF THE INVENTION

1. Field of the Invention

The present invention relates to a hydrophilic treatment method and to a wiring pattern forming method.

2. Description of the Related Art

As illustrated in FIG. 1(a), when a wiring board is manufactured, first, a mask layer 14 made of a resin is formed on a metallic film 12, which is formed on the entire surface of one side of a resin substrate 10. Subsequently, patterning is performed on the mask layer 14. Thus, groove portions 16, 16, ... from which the metallic film 12 is exposed, are formed in a bottom surface according to a wiring pattern to be formed.

Subsequently, as illustrated in FIG. 1(b), wiring patterns 18, 18, ... are formed by filling each of the groove portions 16, 16, ... with metal through electrolytic plating using the metallic film 12 as an electric power supplying layer.

Thereafter, as illustrated in FIGS. 1(c) and 1(d), the wiring patterns 18, 18, ... having desired shapes are formed on the resin substrate 10 by removing the mask layer 14 to thereby remove the exposed metallic film 12.

However, the electrolytic plating using the metallic film 12 may cause air bubbles to adhere to the inner side surface of each of the groove portions 16, 16, ..., which is formed by the mask layer 14, when filled with metal. When electrolytic plating is performed in a state in which such bubbles adhere thereto, the groove portions 16 are filled with metal in a state in which bubbles 100, 100, ... adhere thereto, as illustrated in FIG. 2(a). Thus, the wiring patterns 18 are finally formed so that holes 102, 102, ... are formed therein, as illustrated in FIG. 2(b).

The more easily the wiring patterns 18, in which the holes 102, 102, ..., are formed due to the adhesion of the bubbles 100, 100, ... are formed, the finer the wiring patterns 18 become.

Additionally, the finer the wiring patterns 18 become, the larger the proportion of the holes 102, 102, ..., which are formed due to the adhesion of the bubbles 100, 100, ..., to the wiring patterns 100, 100, ... becomes. Thus, the strength of the wires reduces. Consequently, there is a fear of breaking the wire due to stress applied to the wiring pattern 18 in the subsequent step. Even when the wire is not broken, the values of electric characteristics, such as impedance, of the wiring patterns 18 become different from preset values thereof.

Meanwhile, one of the reasons for the adhesion of bubbles to the inner side surfaces of each of the groove portions 16, which are constituted by that of the mask layer 14, at the time of filling each of the groove portions 16, 16, ... with metal by the electrolytic plating using the metallic film 12 as the power supplying layer is that the inner peripheral surface of each of the groove portion 16 is contaminated by performing patterning on the mask layer 14 and so forth.

Such a stain can be removed therefrom by dipping the resin substrate 10 into a weakly alkaline solution or an alcoholic solution and by performing a degreasing treatment thereon. However, this degreasing treatment promotes the peeling-off of the mask layer 14.

Thus, it has been studied to perform a plasma treatment on the resin substrate 10 to be electrolytic-plated, as proposed in JP-A-2000-127407 (Second Embodiment) which is hereinafter referred as Patent Document 1.

The stain on the inner peripheral surface of each of the groove portions 16, which is caused by the patterning or the like of the mask layer 14, can be removed by performing a plasma treatment on the resin substrate 10 to be electrolytic-plated, as proposed in the Patent Document 1. Further, an adhesion force acting between the mask layer 14 and the metallic film 12 can be enhanced when the electrolytic plating is performed.

However, although this reduces the possibility of occurrence of the phenomenon in which bubbles adhere to the inner side surface of each of the groove portions 16, which is constituted by the mask layer 14, during the electrolytic plating using the metallic film 12 as the power supplying layer, it has been found that this phenomenon still occurs.

According to the present inventor's study of such a phenomenon, the wettability of the inner side surface of each of the groove portions 16, which is constituted by the mask layer 14, with an electrolytic plating solution is insufficient. Thus, when the bubbles 100, 100, ... mixed in the electrolytic plating solution adhere to the inner surface of each of the groove portions 16, the electrolytic plating is continued in a state in which the bubbles 100, 100, ... adhere thereto.

Therefore, it is demanded to enhance the wettability of the inner side surface of each of the groove portions 16, which is constituted by the mask layer 14, with the electrolytic plating solution by performing a plasma treatment.

Incidentally, this enhancement of the wettability of the surface with the electrolytic plating solution can be regarded as equivalent to that of the wettability thereof with water, because most of the electrolytic plating solution is constituted by water.

Further, it is economical to form the metallic film 12 on the entire surface of one side of the resin substrate 10 shown in FIG. 1(a) by performing electroless plating. However, when the metallic film 12 is formed by the electroless plating, it is necessary to enhance the wettability of the resin substrate 10 with an electroless plating solution by dipping the resin substrate 10 into a weakly alkaline solution or an alcoholic solution and by performing a degreasing treatment thereon.

However, because it becomes a problem how to treat such a degreased solution, it is also demanded to enhance the wettability of the resin substrate 10 substantially without using the solution. This enhancement of the wettability of the resin substrate with the electroless plating solution can be also regarded as equivalent to that of the wettability thereof with water, because most of the electroless plating solution is constituted by water.

SUMMARY OF THE INVENTION

Thus, the problems to be solved by the invention are to provide a hydrophilic treatment method, which is enabled to impart sufficient wettability for water to a molded article made of a resin substantially without using a solution, and also to provide a wiring pattern forming method enabled to impart sufficient wettability for water to a resin substrate provided with groove portions, which are formed according to wiring patterns to be formed on a resin mask layer, in at least a surface of one side thereof by performing a plasma treatment substantially without using a solution.

The present inventor made a study so as to solve the problems. Consequently, the present inventor has found that the wettability for water can be enhanced by performing an atmospheric pressure plasma treatment on a resin substrate, onto which water is sprayed, as compared with a resin substrate, on which a plasma treatment is performed in a dry condition without spraying water.

That is, according to an aspect of the invention, there is provided a hydrophilic treatment method, adapted so that a plasma treatment is performed on a molded article made of a resin, and that when hydrophilicity is imparted to the molded article, the plasma treatment is performed in an atmosphere containing a hydrophilic gas that has a hydrophilic group.

According to such a method of the invention, preferably, a film-like or plate-like molded article is used as the molded article. The plasma treatment is performed on at least a surface of one side of the film-like or plate-like molded article. Consequently, sufficient wettability can be imparted to at least a surface of one side of the film-like or plate-like molded article.

Further, according to another aspect of the invention, there is provided a wiring pattern forming method that comprises forming a mask layer made of a resin on a metallic film formed on the entirety of a surface of one side of a resin substrate, subsequently performing patterning on the mask layer to thereby form groove portions each having a bottom surface, from which the metallic film is exposed, according to a wiring pattern to be formed, subsequently performing a plasma treatment on the surface of one side of the resin substrate, in which the groove portions are formed, in an atmosphere containing a hydrophilic gas that has a hydrophilic group, and subsequently performing electrolytic plating using the metallic film as the power supplying layer so that the groove portions are filled with metal to thereby form a wiring pattern.

In these methods according to the invention, the plasma treatment is performed on the molded article or the resin substrate, on which the corona discharge treatment is preliminarily performed. Thus, as compared with a case where only the plasma treatment is performed, the wettability of the molded article or the resin substrate with water can be enhanced. Corona discharge treatment equipment can be simplified by performing this corona discharge treatment under atmospheric pressure.

Further, preferably, the plasma treatment is performed in an atmosphere containing gases of one or more kinds of compounds selected from water, an alcohol, and organic matters each having a carboxylic group. A hydrophilic gas of a compound having a hydrophilic group can easily be made to be contained in the atmosphere, in which a plasma treatment is performed, by performing a plasma treatment on the molded article or the resin substrate, to which liquid containing one or more kinds of compounds selected from water, an alcohol, and organic matters each having a carboxylic group are made to adhere.

Furthermore, plasma treatment equipment can be simplified by performing a plasma treatment under atmospheric pressure.

According to the invention, the wettability of the molded article with water can be enhanced, as compared with the related-art case where the plasma treatment is performed on the molded article in a dry condition. Consequently, the wettability of the molded article with the electroless plating solution can be enhanced substantially without using a solution. Additionally, the treatment of the solution used for degreasing, and so forth can be omitted.

Further, according to the invention, sufficient wettability for water can be imparted to the resin substrate, which is provided with the groove portions, which are formed in at least a surface of one side thereof according to the wiring pattern to be formed on the mask layer made of a resin, without using the solution for peeling off the mask layer, as compared with the related-art case where the plasma treatment is performed on the molded article in the dry condition. Consequently, when a fine wiring pattern is formed by performing electrolytic plating, the electrolytic plating can be prevented from proceeding in a state in which bubbles adhere thereto.

The reasons why sufficient wettability can be imparted to the molded article or the resin substrate according to the invention as compared with the case of performing the plasma treatment thereon in the dry condition are considered as follows.

That is, in the plasma treatment performed in the atmosphere containing a hydrophilic gas having a hydrophilic group, the hydrophilic gas of a compound having a hydrophilic group, which is ionized or radicalized, is bonded by a hydrogen bond to a molecular chain of the resin constituting the molded article or the resin substrate thereby to make the surface of the molded article or the resin substrate hydrophilic.

In addition to such modification of the surface of the molded article or the resin substrate to the hydrophilic one, the removal of contaminant adhering to the surface of the molded article or the resin substrate is achieved by the plasma treatment. Consequently, the wettability of the surface of the molded article or the resin substrate with water can be enhanced.

Additionally, the hydrophilic group ionized or radicalized by the plasma reaches the mask layer constituting the inner side surface of each of the groove portions formed on a surface of one side of the resin substrate to thereby enhance the hydrophilicity of this inner side surface thereof. Consequently, the wettability thereof for water can be enhanced.

DETAILED DESCRIPTION OF THE INVENTION

Hereinafter, an exemplary, non-limiting embodiment of the invention will be explained with reference to the accompanying drawings. In the present invention, terms are presumed to have their ordinary meaning as would be understood by one of ordinary skill in the relevant art. However, terms may also be operationally defined in this disclosure to have a specific meaning.

According to the invention, it is necessary to perform a plasma treatment on a molded article made of a resin in an atmosphere containing a hydrophilic gas that has a hydrophilic group.

A film or plate made of a hydrophobic resin or a hydrophilic resin may be used as the molded article made of such a resin.

Incidentally, the hydrophilic resin is a resin having a hydrophilic group in a molecular chain thereof. For example, a polyamide resin and a polyimide resin correspond thereto.

Additionally, even in a case where the molded article is made of such a hydrophilic resin, the wettability of the molded article for an electrolytic plating solution or an electroless plating solution is insufficient. Thus, the improvement of the molded article is needed.

Further, gaseous compounds including groups, such as "—OH", "—COOH", and "—CO—", can appropriately be used as the hydrophilic gas having a hydrophilic group. Such a gaseous compound can be used singly. Alternatively, two or more kinds of such gaseous compounds can be used by being mixed with one another.

To form an atmosphere containing a gaseous compound, a gaseous hydrophilic compound may be injected together with another gas into an atmosphere, in which a plasma treatment is performed. However, a plasma treatment can be also performed in the atmosphere, which contains a hydrophilic gas having a hydrophilic group, by performing a plasma treatment on a molded article to which liquid containing a hydrophilic compound is made to adhere.

Water, an alcohol, and organic matters each having a carboxylic group, which are liquid at room temperature and easily gasified by a plasma treatment, can preferably be used as the hydrophilic compound. An acetic acid may preferably be used as the organic matter having a carboxylic group.

As the plasma treatment, for example, a plasma treatment performed under reduced pressure, which is used by the method disclosed in the Patent Document 1, may be employed. However, an atmospheric pressure plasma treatment, which is a plasma treatment performed under atmospheric pressure, may preferably be employed.

Figure 3:
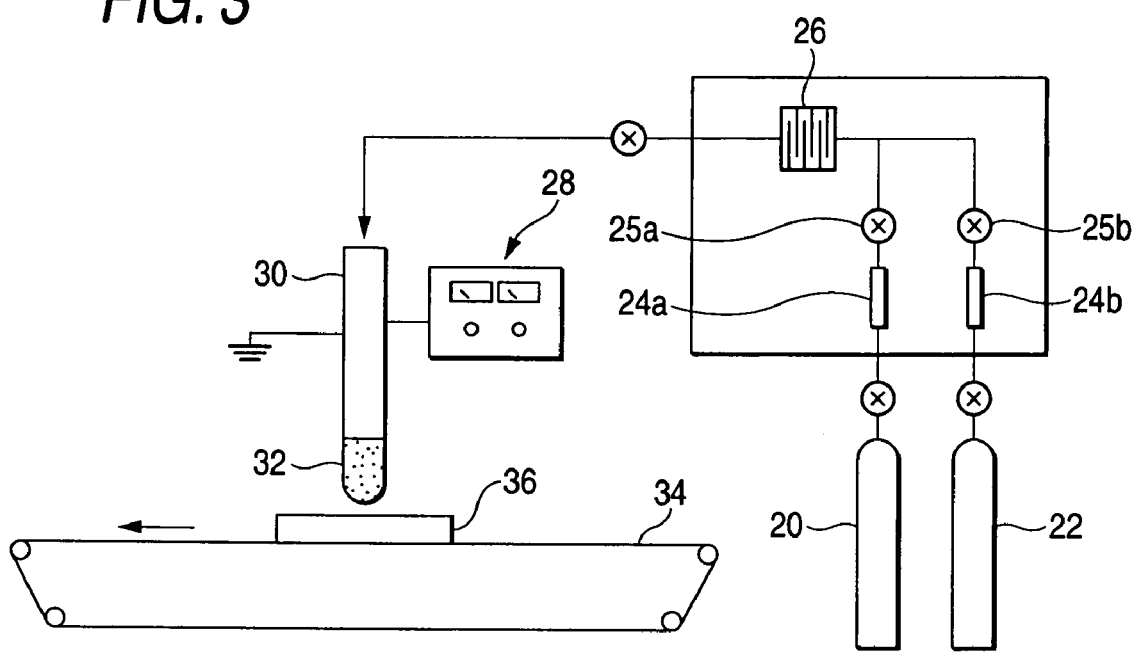
FIG. 3 is a schematic diagram illustrating an exemplary, non-limiting example of an atmospheric pressure plasma treatment apparatus according to the present invention.

FIG. 3 shows an exemplary, non-limiting example of an atmospheric pressure plasma treatment apparatus for performing such an atmospheric pressure plasma treatment. In the atmospheric pressure plasma treatment apparatus shown in FIG. 3, the flow rate of a carrier gas supplied from a carrier gas cylinder 20 and that of a reaction gas supplied from a reaction gas cylinder 22 are adjusted by valves 25a and 25b so that the flow rates measured by flowmeters 24a and 24b are equal to predetermined rates, respectively. Then, the carrier gas and the reaction gas are mixed by a mixer 26. Subsequently, the mixed gas is supplied into a reactor 30 that is connected to a high-frequency power supply 28.

The carrier gas and the reaction gas supplied into the reactor 30 are plasmatized therein and then jetted therefrom as a plasma jet 32. Subsequently, the plasma jet 32 is emitted toward a molded article 36 made of a resin, which is put on a conveyer belt that moves in the direction of an arrow.

The setting of an atmosphere, in which such a plasma jet 32 is jetted toward the molded article 36, to be an atmosphere, which contains a hydrophilic gas of a compound having a carboxylic group, can be achieved by emitting the plasma jet 32 to the molded article 36 and also spraying gases of one or more kinds of compounds selected from water, an alcohol, and organic matters, such as an acetic acid, each having a carboxylic group. Especially, it is preferable to use the molded article 36, to which liquid containing one or more kinds of compounds selected from water, an alcohol, and organic matters, such as an acetic acid, having a carboxylic group is made by being sprayed thereon in such a way as to adhere, for a plasma treatment. The liquid adhering to the molded article 36 can be gasified by the plasma jet 32 thereby to provide a hydrophilic atmosphere around the molded article 36.

A nitrogen gas or a helium gas can be employed as the carrier gas used in the atmospheric pressure treatment apparatus shown in FIG. 3.

As compared with a case where the molded article 36, on which only a plasma treatment is performed, is used, the wettability of the molded article 36 with water can be enhanced by preliminarily performing a corona discharge treatment on the molded article 36 on which a plasma treatment is performed.

Further, in the atmospheric pressure plasma treatment apparatus shown in FIG. 3, a plasma treatment can be performed by simultaneously moving the molded article put on the conveyer belt 34. Thus, a film-like or plate-like molded article is put thereon as the molded article 36, and the plasma treatment can continuously performed on the surface of the one side thereof.

Incidentally, the corona discharge treatment equipment can be simplified by performing a corona discharge treatment under atmospheric pressure.

Because the wettability of the surface of such a molded article 36, on which the plasma treatment is performed, with water is enhanced, the wettability thereof with a plating solution can be enhanced. Thus, a uniformly plated layer can be formed on the surface of the molded article 36 by dipping the molded article 36 into an electroless plating solution and then performing electroless plating thereon.

Incidentally, the state, in which the wettability of the molded article 36 with water is enhanced, disappears in a day or so in a case where the plasma-treated molded article 36 is left untouched in the air. Thus, it is necessary to quickly perform plating and so forth on the molded article 36.

Furthermore, in a case where a treatment, such as plating, to be performed on the plasma-treated molded article 36 is delayed, it is preferable that the plasma-treated molded article 36 is wrapped with aluminum foil. This is because the duration of the state, in which the wettability of the surface of the molded article 36 with water is enhanced, can be long, as compared with the case in which the article 36 is left untouched in the air.

The aforementioned plasma treatment for making the surface of the molded article hydrophilic can preferably be performed on a wiring board used in a semiconductor apparatus. Especially, the plasma treatment for making a surface of one side of the resin substrate 10 hydrophilic can preferably be employed as a pretreatment to be performed for performing electrolytic plating on the surface of the one side of the resin substrate 10 by using the metallic film 12 as the power supplying layer in a state, in which the groove portions 16, 16, . . . are formed according to the wiring pattern to be formed, by performing patterning on the mask layer 14, which is made of a resin and formed on the metallic film 12 covering the entire surface of the one side of the resin substrate 10, as illustrated in FIG. 1(a), so that the metallic film 12 is exposed from the bottom surface of each of the groove portions 16, 16, . . . .

Figure 1:
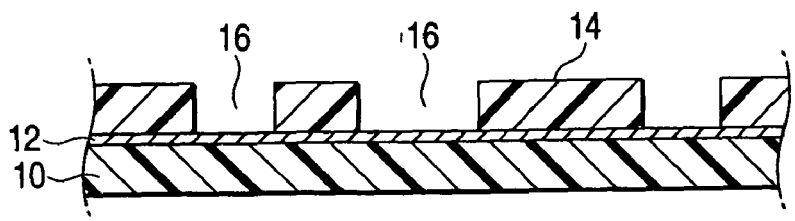
FIGS. 1($a$) to 1($d$) are diagrams illustrating the steps of an example of a manufacturing method for a wiring board.
Figure 1:
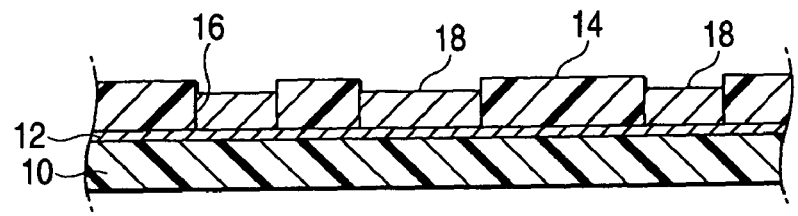
Figure 1:
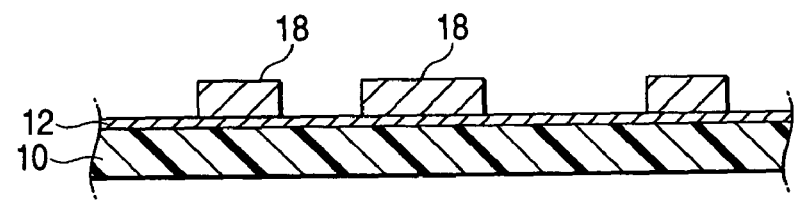
Figure 1:
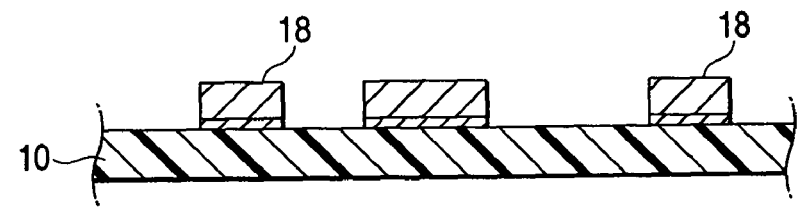

That is, it is necessary to perform removal of stains adhering to the surface of one side of the resin substrate 10 as the pretreatment for performing the electrolytic plating on the surface of one side of the resin substrate 10 shown in FIG. 1(a). However, a degreasing treatment for dipping the resin substrate 10 into a weakly alkaline solution or an alcoholic solution makes the mask layer 14 to easily be peeled off.

In this respect, the atmospheric pressure plasma treatment apparatus shown in FIG. 3 performs a plasma treatment on the surface of the one side of the resin substrate 10 to thereby degrease the surface of the one side thereof.

Additionally, the wettability of the inner side surface of each of the groove portions 16, 16, . . . , which is constituted by the mask layer 14, can be enhanced by performing a plasma treatment in the atmosphere containing a hydrophilic gas of a compound having a hydrophilic group. Thus, holes are prevented from being formed in the wiring pattern due to the bubbles adhering to the inner side surface of each of the groove portions 16, 16, . . . when the electrolytic plating is performed on the resin substrate 10 by being dipped into an electrolytic plating solution.

When a plasma treatment to be performed on the surface of one side of the resin substrate 10 shown in FIG. 1(a) is performed by using the atmospheric plasma apparatus shown in FIG. 3, it is preferable that the plasma jet 32 is jetted onto the surface of one side of the resin substrate 10, to which the liquid containing one or more kinds of compounds selected from water, an alcohol, and organic matters, such as an acetic acid, each having a carboxylic group.

Even in this case, a plasma treatment is performed in the atmosphere, which contains a hydrophilic gas, by using the atmospheric pressure plasma treatment apparatus shown in FIG. 3 after a corona discharge treatment is performed on the surface of one side of the resin substrate 10. Consequently, as compared with the case where only the plasma treatment is performed, the wettability of the surface of one side of the resin substrate 10 with water can be enhanced.

Further, preferably, after a plasma treatment is performed on the surface of one side of the resin substrate shown in FIG. 1(a) in the atmosphere containing a hydrophilic gas, it is preferable that the electrolytic plating using the metallic film 12 as the power supplying layer is quickly performed so as to form the wiring patterns 18, 18, . . . as shown in FIG. 1(b). This is because the effect of enhancing the wettability of the molded article 36 with water disappears in a day or so in a case where the resin substrate 10 is left untouched in the air.

In a case where electrolytic treatment, such as electrolytic plating, to be performed on the resin substrate 10 is delayed, the rate, at which the effect of enhancement of the wettability of the resin substrate 10 with water disappears, can be reduced by wrapping up the plasma-treated resin substrate 10 with aluminum foil.

FIRST EXAMPLE

A corona discharge treatment with output power of 200 W was performed on the surface of one side of a 50-µm-thick polyimide film under atmospheric pressure. This corona discharge treatment was performed twice on the surface of the one side of the polyimide film by adjusting the movement speed of a conveyer, on which the polyimide film was put, to 2 m/min.

Subsequently, a 5% ethanol aqueous solution was sprayed onto the surface of the one side of the corona-discharge-treated polyimide film. Then, waterdrops were wiped out with paper. Subsequently, a plasma treatment was performed thereon. The output power by this plasma treatment was 50 W. This plasma treatment used a nitrogen gas as the carrier gas, and also used an oxygen gas, whose concentration was 93 ppm (vol.), as the reaction gas.

The wettability of the surface of the one side of the polyimide film was measured by a drop method. A contact angle was 35.2°.

Meanwhile, before the corona discharge treatment and the plasma treatment were performed, a contact angle on the surface of the one side of the polyimide film was 65.8°.

Figure 4:
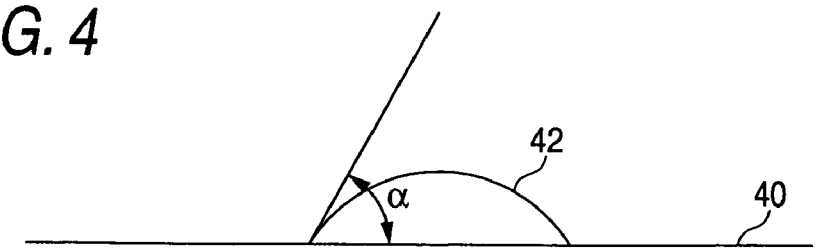
FIG. 4 is an explanatory diagram illustrating a contact angle used in a drop method.

Incidentally, the drop method was used for measuring the contact angle α of a waterdrop 42 dropped onto the surface 40 of the polyimide film, as illustrated in FIG. 4. The smaller the contact angle α became, the more highly the wettability of the surface 40 with water was enhanced.

FIRST COMPARATIVE EXAMPLE

A plasma treatment was performed similarly to the first example, except that a plasma treatment was performed on the surface of the one side of the polyimide film in a dry condition without spraying a 5% ethanol aqueous solution. After the plasma treatment, the contact angle α on the surface of the one side of the polyimide film was 38.8°, which was larger than the contact angle α on the surface of the one side of the polyimide film in the first example after the plasma treatment was performed.

Thus, the wettability of the surface of the one side of the polyimide film with water can be enhanced by performing a plasma treatment on the surface of the one side of the polyimide film on which a 5% ethanol aqueous solution was sprayed, as compared with the case where a plasma treatment was performed thereon in a dry condition.

SECOND EXAMPLE

A plasma treatment was performed similar to the first example, except that a corona discharge was not performed in the similar constitution to that of the first example. A contact angle α on the surface of the one side of the polyimide film was 59.4° after the plasma treatment.

Further, a plasma treatment was performed similarly to the first example, except that the plasma treatment was performed on the surface of the one side of the polyimide film in the dry condition without spraying a 5% ethanol aqueous solution, in the similar constitution to that of the first example. A contact angle α on the surface of the one side of the polyimide film was 65.7° after the plasma treatment. This contact angle was larger than the contact angle α on the surface of the one side of the polyimide film, on which a 5% ethanol aqueous solution was sprayed and a plasma treatment was performed.

Thus, even in a case where a corona discharge was not performed on a polyimide film, the wettability of the surface of one of the polyimide film with water can be enhanced by spraying a 5% ethanol aqueous solution thereon and performing a plasma treatment thereon in the dry condition, as compared with the case where a plasma treatment was performed on the film which was in the dry condition.

THIRD EXAMPLE

A plasma treatment was performed similarly to the first example, except that a plasma treatment was performed with output power of 150 W in the similar constitution to that of the first example, that a helium gas was used as the carrier gas, and that the concentration of an oxygen gas serving as a reaction gas was set at 123 ppm (vol.). A contact angle α on the surface of the one side of the polyimide film was 24.5° after the plasma treatment.

FOURTH EXAMPLE

A plasma treatment was performed similarly to the third example, except that a plasma treatment was performed on an polyimide film, on which a corona discharge operation was not performed, in the similar constitution to that of the third example. A contact angle α on the surface of the one side of the polyimide film was 28.7° after the plasma treatment.

Further, a plasma treatment was performed similarly to the third example, except that a plasma treatment was performed on the surface of one side of the polyimide film, on which a corona discharge was not performed, in the dry condition without spraying a 5% ethanol aqueous solution in the similar constitution to that of the third example. A contact angle α on the surface of the one side of the polyimide film was 35.3° after the plasma treatment. This contact angle was larger than the contact angle α on the surface of the one side of the polyimide film, on which a 5% ethanol aqueous solution was sprayed and a plasma treatment was performed.

Thus, even in a case where a corona discharge was not performed on a polyimide film, the wettability of the surface of one of the polyimide film with water can be enhanced by spraying a 5% ethanol aqueous solution thereon and performing a plasma treatment thereon in the dry condition, as compared with the case where a plasma treatment was performed on the film which was in the dry condition.

FIFTH EXAMPLE

A 50-μm-thick polyimide film was used as the resin substrate 10. As illustrated in FIG. 1(a), a mask layer 14 constituted by a plating resist was formed on a copper film 12, which served as the metallic film was formed on the entire surface of one side of the resin substrate 10 by electroless plating. Then, patterning was performed on the mask layer 14 to thereby form groove portions 16, 16, . . . , from the bottom surface of which the metallic film 12 was exposed, according to the wiring pattern to be formed. The interval between the groove portions 16, 16, . . . was 10 μm.

A corona discharge treatment with output power of 200 W was performed on the surface of the one side of such a resin substrate 10 under atmospheric pressure. This corona discharge treatment was performed twice thereon by simultaneously adjusting the movement speed of a conveyer, on which the resin substrate 10 was put, to 2 m/min.

Subsequently, a 5% ethanol aqueous solution was sprayed on the surface of the one side of the corona-discharge-treated resin substrate 10. Then, waterdrops were wiped out with paper. Subsequently, a plasma treatment was performed thereon. The output power by this plasma treatment was 50 W. This plasma treatment used a nitrogen gas as the carrier gas, and also used an oxygen gas, whose concentration was 93 ppm (vol.), as the reaction gas.

As illustrated in FIG. 1(b), wiring patterns 18, 18, . . . having desired shapes were formed in the surface of the one side of the corona-discharge-treated resin substrate 10 by performing electrolytic plating using a copper film 12 as the power supplying layer so that each of the groove portions 16, 16, . . . was filled with copper.

Further, as illustrated in FIGS. 1(c) and 1(d), a wiring board, in which the wiring patterns 18, 18, . . . having desired shapes were formed on the resin substrate 10, was obtained by removing the copper film 12, which was exposed by removing the mask layer 14.

Figure 2:
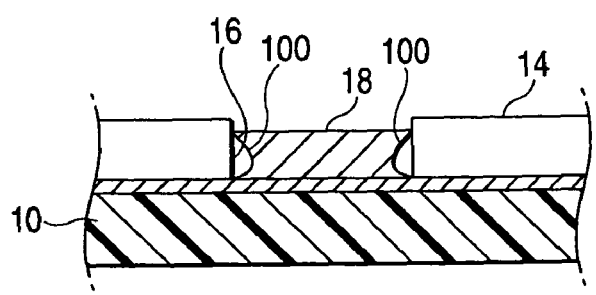
FIGS. 2($a$) and 2($b$) are explanatory diagrams illustrating problems concerning the manufacturing method illustrated in FIGS. 1($a$) to 1($d$).
Figure 2:
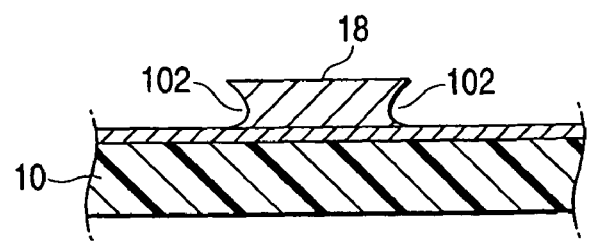

According to observation of the formed wiring patterns 18, 18, . . . through a microscope, it was found that holes 102 as illustrated in FIG. 2(b) were not formed in the formed wiring patterns 18, 18, . . . , and that the wiring patterns 18, 18, . . . had favorable shapes.

The present invention has been explained above referring to the embodiment. However, it should be noted that the present invention is not limited to the above specific embodiment. Variations may be made by those skilled in the art. It is clear that the varied or improved embodiments are included in the technical scope of the present invention.

What is claimed is:

1. A hydrophilic treatment method, comprising:
performing a plasma treatment on a molded article made of a resin,
wherein when hydrophilicity is imparted to said molded article, the plasma treatment is performed at atmospheric pressure in an atmosphere containing a hydrophilic gas that has a hydrophilic group and which gas is selected from the group consisting of an alcohol, an organic matter having a carboxylic group, and combinations thereof.

2. The hydrophilic treatment according to claim 1, further comprising:
performing a corona discharge treatment on said molded article,
wherein the plasma treatment is performed on said molded article on which the corona discharge treatment is preliminarily performed.

3. The hydrophilic treatment method according to claim 1, wherein the plasma treatment is performed on said molded article, to which liquid containing one or more kinds of compounds selected from water, an alcohol, and organic matters each having a carboxylic group are made to adhere.

4. The hydrophilic treatment method according to claim 1, wherein a film-like or plate-like molded article is used as the molded article, and wherein the plasma treatment is performed on at least a surface of one side of the film-like or plate-like molded article.

5. A wiring pattern forming method comprising:
forming a mask layer made of a resin on a metallic film formed on the entirety of a surface of one side of a resin substrate;
subsequently performing patterning on said mask layer to thereby form groove portions each having a bottom surface, from which said metallic film is exposed, according to a wiring pattern to be formed;
subsequently performing a plasma treatment on a surface of one side of said resin substrate, in which said groove portions are formed, at atmospheric pressure in an atmosphere containing a hydrophilic gas that has a hydrophilic group and which gas is selected from the group consisting of an alcohol, an organic matter having a carboxylic group, and combinations thereof; and
subsequently performing electrolytic plating using said metallic film an electric power supplying layer so that said groove portions are filled with metal to thereby form a wiring pattern.

6. The wiring pattern forming method according to claim 5, further comprising:
performing a corona discharge treatment on said molded article,
wherein the plasma treatment is performed on said resin substrate on which the corona discharge treatment is preliminarily performed.

7. The wiring pattern forming method according to claim 5, wherein the plasma treatment is performed on said resin substrate, to which liquid containing one or more kinds of compounds selected from water, an alcohol, and organic matters each having a carboxylic group are made to adhere.

8. A hydrophilic treatment method, comprising:
providing a molded article made of a resin;
performing a corona discharge treatment on the molded article;
after performing the corona discharge treatment, performing a plasma treatment on the molded article to impart hydrophilicity;

wherein when hydrophilicity is imparted to said molded article, the plasma treatment is performed at atmospheric pressure in an atmosphere containing a hydrophilic gas that has a hydrophilic group and which gas is selected from the group consisting of an alcohol, an organic matter having a carboxylic group, and combinations thereof.

9. The method of claim 8 wherein the resin is a polyimide resin.

10. The method of claim 8 wherein the corona discharge treatment is performed at atmospheric pressure.

11. The method of claim 8 further comprising:
prior to performing the plasma treatment and after performing the corona discharge treatment, spraying a liquid containing a compound selected from an alcohol, an organic matter having a carboxylic group, and combinations thereof, onto the molded article.

12. The method of claim 11 wherein during the plasma treatment, the liquid sprayed onto the molded article is gasified.

13. The method of claim 8 further comprising:
after performing the plasma treatment on the molded article, wrapping the molded article to prevent exposure to air.

14. The method of claim 13 wherein the molded article is wrapped with aluminum foil.

* * * * *